US009502220B2

(12) United States Patent
Okita et al.

(10) Patent No.: US 9,502,220 B2
(45) Date of Patent: Nov. 22, 2016

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Hyogo (JP); Bunji Mizuno, Nara (JP); Tomohiro Okumura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/837,400

(22) Filed: Aug. 27, 2015

(65) Prior Publication Data

US 2016/0064196 A1 Mar. 3, 2016

(30) Foreign Application Priority Data

Sep. 2, 2014 (JP) ................................. 2014-178086

(51) Int. Cl.
*C23F 1/00* (2006.01)
*H01J 37/32* (2006.01)
*H01L 21/3213* (2006.01)

(52) U.S. Cl.
CPC .... *H01J 37/32651* (2013.01); *H01J 37/32366* (2013.01); *H01J 37/32633* (2013.01); *H01J 37/32715* (2013.01); *H01J 37/32733* (2013.01); *H01L 21/32139* (2013.01)

(58) Field of Classification Search
CPC .............. H01J 37/32715; H01J 37/32633; H01J 37/32651; H01J 37/32642; H01J 37/32743; H01L 21/3065; H01L 21/31116
USPC .............. 156/345.3, 345.34, 345.37, 345.53; 216/58, 67
See application file for complete search history.

(56) References Cited

U.S. PATENT DOCUMENTS

| 2009/0139853 | A1* | 6/2009 | Yamamoto ............... C23C 14/35 204/192.1 |
| 2010/0216313 | A1* | 8/2010 | Iwai .................. H01J 37/32623 438/729 |
| 2010/0252417 | A1* | 10/2010 | Allen .................... C23C 14/345 204/192.12 |

(Continued)

FOREIGN PATENT DOCUMENTS

JP 2009-94436 A 4/2009

*Primary Examiner* — Lan Vinh
(74) *Attorney, Agent, or Firm* — Pearne & Gordon LLP

(57) ABSTRACT

A plasma processing apparatus that performs plasma processing on a substrate held on a transport carrier including an annular frame and a holding sheet. The apparatus includes: a process chamber; a plasma excitation device that generates plasma; a stage in the chamber; a cooling mechanism for cooling the stage; a cover that partly covers the holding sheet and the frame and has a window section through which the substrate is partly exposed to plasma; and a movement device that moves a relative position of the cover to the frame. The cover has a roof section, a cylindrical circumferential side section extending from a circumferential edge of the roof section toward the stage, and a correction member that protrudes from the roof section and/or the circumferential side section toward the frame and presses the frame onto the stage to correct warpage of the frame.

17 Claims, 21 Drawing Sheets

(56) References Cited

U.S. PATENT DOCUMENTS

2013/0230974 A1\* 9/2013 Martinez .......... H01L 21/68771
438/464

\* cited by examiner

PLASMA PROCESSING APPARATUS AND PLASMA PROCESSING METHOD

CROSS-REFERENCES TO RELATED APPLICATION(S)

This application is based on and claims priority from Japanese Patent Application No. 2014-178086 filed on Sep. 2, 2014, the entire contents of which are incorporated herein by reference.

BACKGROUND

1. Field of the Invention

One or more embodiments of the present invention relate to a plasma processing apparatus and a plasma processing method for performing plasma processing on a substrate held on a transport carrier that has an annular frame and a holding sheet.

2. Description of Related Art

In a plasma processing apparatus having a substrate as a processing target, which is held on a transport carrier that has an annular frame and a holding sheet, it is necessary to prevent thermal damage to the frame and the holding sheet due to plasma. This is because a defect such as expansion (deformation) of the holding sheet is caused when the holding sheet containing a resin material is heated. Patent Document 1 proposes that the frame and the holding sheet are covered with a donut-shaped cover having a window section at the center. In this manner, the frame and the holding sheet are covered from plasma. Meanwhile, plasma processing is performed on the substrate exposed through the window section.

Patent Document 1 is JP-A-2009-94436.

SUMMARY

A transport carrier holding a substrate is conveyed into a chamber provided in a plasma processing apparatus and is loaded on a stage provided in the chamber. Normally, a cooling mechanism is provided on the stage such that thermal damage to the transport carrier due to plasma is prevented.

Normally, a frame is formed of metal and/or a resin and has rigidity. Thus, when the frame has a slight warpage, a minute gap is formed between the frame and a stage when the frame is loaded on the stage. When plasma processing is performed in a state in which such a gap is formed, the gap causes abnormal discharge in a chamber or insufficient cooling of a transport carrier (particularly, the frame). In this manner, an inappropriate process through the plasma processing is performed and a transport trouble due to deterioration of the holding sheet occurs and stability of the plasma processing deteriorates.

The transport carrier that has an annular frame and a holding sheet is used not only in a case of performing the plasma processing but also in a case where a substrate is processed using a related-art dicing method with a blade or laser. In the related-art dicing method, there is no need to take into account heat due to the plasma and warpage of the frame is mechanically corrected in processing the substrate. Thus, the warpage of the frame will never be a problem.

According to one aspect of the present invention, a plasma processing apparatus that performs plasma processing on a substrate held on a transport carrier which has an annular frame and a holding sheet, the plasma processing apparatus including: a chamber that has a process chamber configured to be decompressed; a plasma excitation device that generates plasma in the process chamber; a stage in the chamber, on which the transport carrier is loaded; a cooling mechanism configured to cool the stage; a cover that covers a part of the holding sheet and at least a part of the frame of the transport carrier loaded on the stage and that has a window section through which at least a part of the substrate is exposed to plasma; and a movement device that moves a relative position of the cover with respect to the frame, wherein the cover has a roof section that faces the frame loaded on the stage, a cylindrical circumferential side section that extends from a circumferential edge of the roof section to a side of the stage, and a correction member that protrudes from the roof section and/or the circumferential side section toward the frame loaded on the stage and presses the frame onto the stage to correct warpage of the frame.

According to another aspect of the present invention, a plasma processing method of performing plasma processing on a substrate held on a transport carrier that has an annular frame and a holding sheet, the plasma processing method including: (i) a step of conveying the transport carrier holding the substrate into a chamber provided in a plasma processing apparatus and loading the transport carrier on a stage that is equipped with a cooling mechanism and provided in the chamber; (ii) a step of covering the holding sheet and the frame of the transport carrier loaded on the stage, with a cover that has a window section through which at least a part of the substrate is exposed to plasma; and (iii) a step of generating plasma in the chamber and performing the plasma processing on the at least a part of the substrate through the window section, wherein the cover has a roof section that faces the frame loaded on the stage, a cylindrical circumferential side section that extends from a circumferential edge of the roof section to a side of the stage, and a correction member that protrudes from the roof section and/or the circumferential side section toward the frame loaded on the stage and presses the frame onto the stage to correct warpage of the frame, and warpage of the frame is corrected by the correction member in the step (ii).

According to one or more embodiments of the present invention, it is possible to prevent abnormal discharge due to warpage of an annular frame or insufficient cooling of a transport carrier. Accordingly, process stability of plasma processing is enhanced.

DETAILED DESCRIPTION

Next, embodiments of the present invention will be described with reference to the drawings. However, the technical scope of the present invention is not limited to the following description.

First Embodiment

Figure 1:
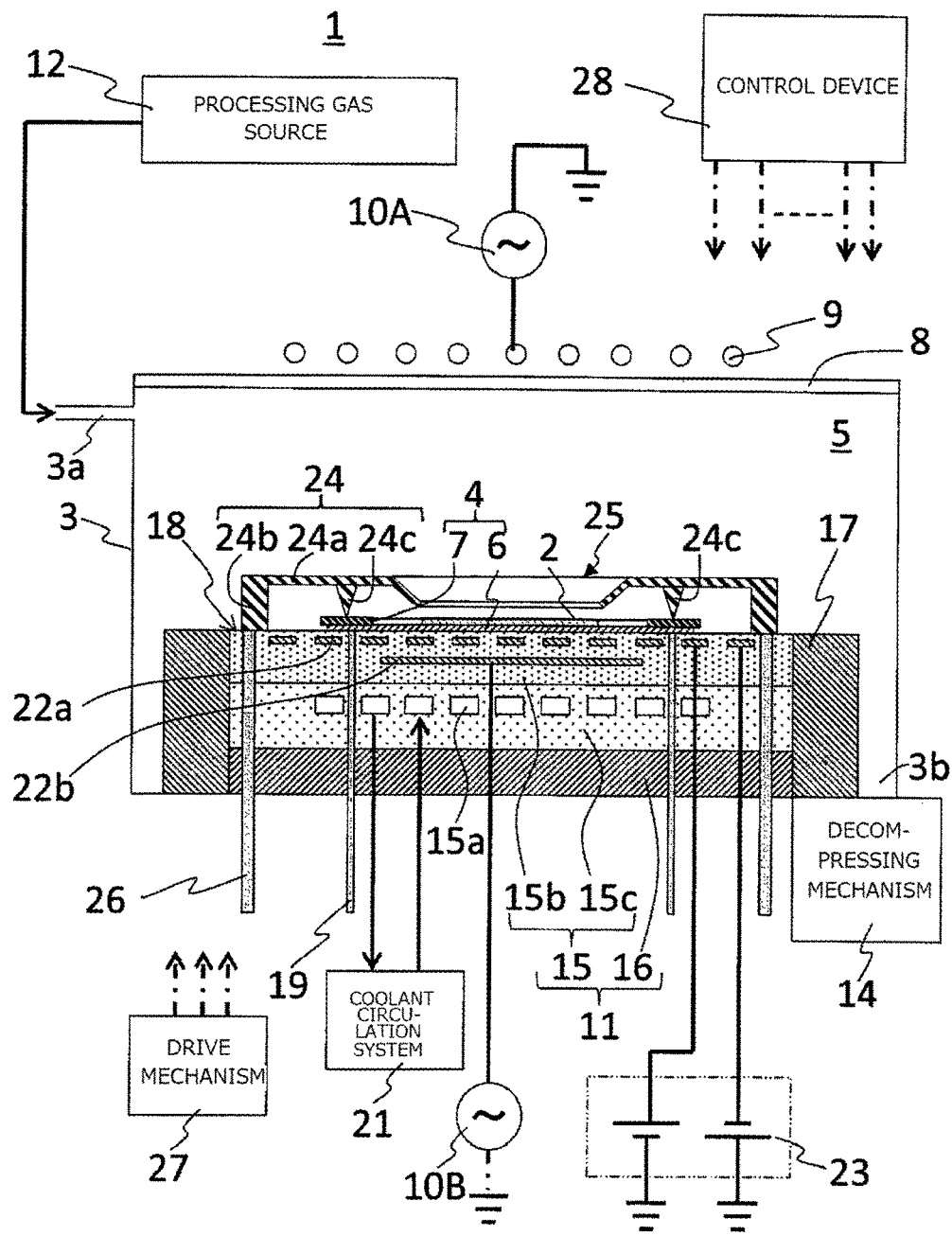
FIG. 1 is a sectional view conceptually showing a first state of a plasma processing apparatus according to a first embodiment of the present invention.

FIG. 1 is a sectional view conceptually showing a structure of a dry etching apparatus 1 which is a plasma processing apparatus according to a first embodiment of the present invention.

The dry etching apparatus 1 performs plasma dicing as plasma processing on a substrate 2 held on a transport carrier 4 that includes an annular frame 7 and a holding sheet 6. The plasma dicing is a method in which the substrate 2 such as a silicon wafer in which a plurality of integration circuits (IC) are formed is cut along a border line (slit) through dry etching and a plurality of individual ICs are formed.

The dry etching apparatus 1 includes a chamber (vacuum vessel) 3 which has a process chamber 5 which can be decompressed. The transport carrier 4 holding the substrate 2 is conveyed into the process chamber 5 from an openable/closable entrance (not shown) of the chamber 3.

A gas needed for generating plasma is supplied from a processing gas source 12 through piping to a gas guiding port 3a of the chamber 3. That is, the processing gas source 12 and the piping constitute at least a part of a process gas supply unit. The chamber 3 has an outlet 3b for gas emission from and decompression of the process chamber 5. The outlet 3b is connected to a decompressing mechanism 14 that includes a vacuum pump.

An upper electrode (antenna) 9 that constitutes a plasma excitation device is disposed above a dielectric wall 8 that closes the top of the chamber 3 of the dry etching apparatus 1. The upper electrode 9 is electrically connected to a first high-frequency power source 10A. A stage 11 on which the transport carrier 4 holding the substrate 2 is loaded is disposed on the bottom side of the process chamber 5. The transport carrier 4 is loaded on the stage 11, having a posture in which the surface holding the substrate 2 faces the upper electrode 9.

The stage 11 includes an electrode section 15 and a base 16 that holds the electrode section 15. An exterior case 17 surrounds a periphery of the electrode section 15 and the base 16. The electrode section 15 is configured to have a thin dielectric section 15b having a loading surface 18 of the transport carrier 4 and a metallic section 15c having a coolant flow path 15a. The coolant flow path 15a communicates with a coolant circulation system 21 that performs circulation of coolant having a controlled temperature in the coolant flow path 15a. The coolant flow path 15a and the coolant circulation system 21 constitute a cooling mechanism for cooling the stage 11.

Figure 2:
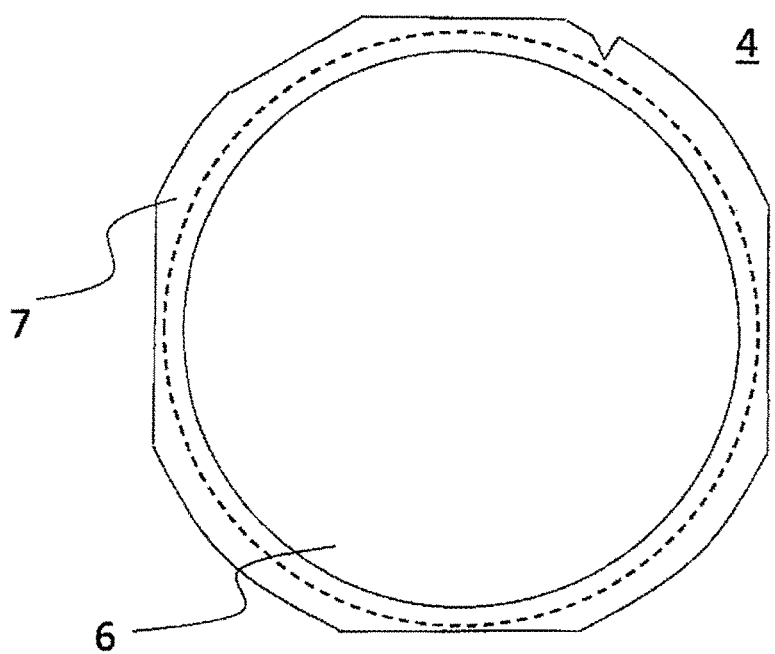
FIG. 2 is a top view of a transport carrier.
Figure 3:
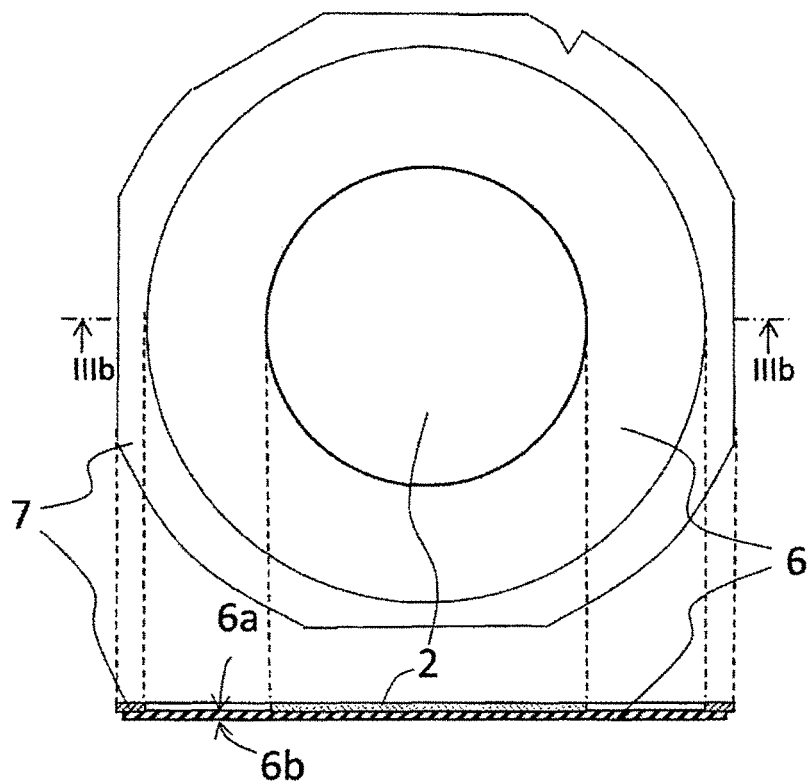
FIG. 3A is a top view of the transport carrier that holds a substrate and FIG. 3B is a sectional view taken along line IIIB-IIIB in FIG. 3A.

FIG. 2 is a top view of an example of the transport carrier. The transport carrier 4 includes the elastically extensible holding sheet 6 and the frame 7 having rigidity. FIG. 3A is a top view of the transport carrier 4 that holds the substrate 2 and FIG. 3B is a sectional view taken along line IIIB-IIIB in FIG. 3A. The holding sheet 6 has a surface (adhesive surface 6a) with an adhesive and a surface (non-adhesive surface 6b) without an adhesive.

The frame 7 has an opening with an area which is equal to or greater than that of the substrate 2 as a target object of the plasma processing and is substantially uniformly thin. There is no limitation on the shape of the opening of the frame 7 and the shape may be a circle or may be a polygon such as a rectangle or a hexagon. A notch or a corner cut for positioning may be provided on the frame 7. Examples of a material of the frame 7 include metal such as aluminum or stainless steel, a resin, and the like. It is preferable that the frame 7 has an inner diameter greater than an inner diameter of the cover 24 to be described below and has the maximum outer diameter smaller than an outer diameter of the cover 24.

The holding sheet 6 has an area which is slightly less than an area within an exterior outline of the frame 7. A circumferential edge section of one surface of the holding sheet 6 is bonded to one surface of the frame 7. There is no need to bond the holding sheet all over the entire width of the frame 7 and, for example, the holding sheet may be bonded in a region having a width of about 10 mm from the inner side of the frame 7. In this manner, the holding sheet 6 is fixed to the frame 7 to cover the opening of the frame 7. The holding sheet 6 can be configured of, for example, a UV curing type acrylic adhesive (adhesive surface 6a) and a base material (non-adhesive surface 6b) of polyolefin. It is preferable that the adhesive contains a component which loses an adhesive force through ultraviolet irradiation. In this manner, the ultraviolet irradiation is performed after dicing and thereby, individualized substrates (chips) are likely to be peeled off from the adhesive surface 6a.

The substrate 2 is bonded to the adhesive surface 6a of the holding sheet 6 to be positioned in the opening of the frame 7. Since the holding sheet 6 is flexible, it is difficult to stably transport the individualized substrate 2 (chip) through dicing only by bonding the substrate 2 to the holding sheet 6. The holding sheet 6 to which the substrate 2 is bonded is fixed to the frame 7 having rigidity and thereby, it is easy to transport the substrate 2 even after the dicing is performed. The center of the substrate 2 is disposed at the center of the opening of the frame 7 and thereby, an annular region of the adhesive surface 6a, through which exposure occurs with a certain width, is formed between the substrate 2 and the frame 7. When the plasma processing is performed, the annular region corresponds to a region that is covered by the cover 24 to be described below.

There is no particular limitation on the substrate 2 as a target object of the plasma process. Examples of a material of the substrate 2 include single crystal Si, $SiO_2$, SiC, and the like. There is no particular limitation on the shape of the substrate 2 and, for example, the shape is a circle or a polygon. In addition, there is no particular limitation on the size of the substrate 2 and, for example, the maximum diameter is about 50 mm to 300 mm. A cut such as an orientation flat or a notch may be provided on the substrate 2.

A resist mask (not shown) having a desirable shape is formed on the surface of the substrate 2, to which the holding sheet 6 is not bonded. A portion in which the resist mask is formed is protected from etching by plasma. A portion in which the resist mask is not formed is etched by plasma from the surface thereof to the back surface.

When the plasma processing is performed, the cover 24 is provided above the stage 11 in the process chamber 5 and covers a part (annular region) of the holding sheet 6 and the frame 7 of the transport carrier 4 loaded on the stage 11. The exterior outline of the cover 24 is circular and it is preferable that the exterior outline is formed to be sufficiently greater than the exterior outline of the transport carrier 4. The cover 24 has a donut-shaped roof section 24a and a cylindrical circumferential side section 24b that extends from the circumferential edge of the roof section 24a to a side of the stage 11 with a bent portion interposed therebetween. In addition, the cover 24 has a circular window section 25 at the center of the roof section 24a. During the plasma process, the roof section 24a covers a part of the holding sheet 6 and at least a part of the frame 7 and at least a part of the substrate 2 is exposed to the plasma through the window section 25. A tapered recessed portion in which an elevation is gradually lowered toward the center is formed around the window section 25 of the roof section 24a. Examples of a material of the cover 24 include ceramics such as quartz or alumina, aluminum with which an alumite process is performed on the surface thereof, and the like. The cover 24 is provided to cover the entire annular region of the holding sheet 6 and the entire frame 7, which is desirable in that the holding sheet and the flame are blocked from the plasma. Here, there may be a region which is not covered by the cover 24, on a part of the annular region of the holding sheet 6 and a part of the frame 7. In this case, it is preferable that 50% or more of the area of the annular region of the holding sheet 6 is covered by the cover 24. In addition, it is preferable that 50% or more of the area of the top surface (surface on the side facing the cover 24) of the frame 7 is covered by the cover 24.

Figure 4:
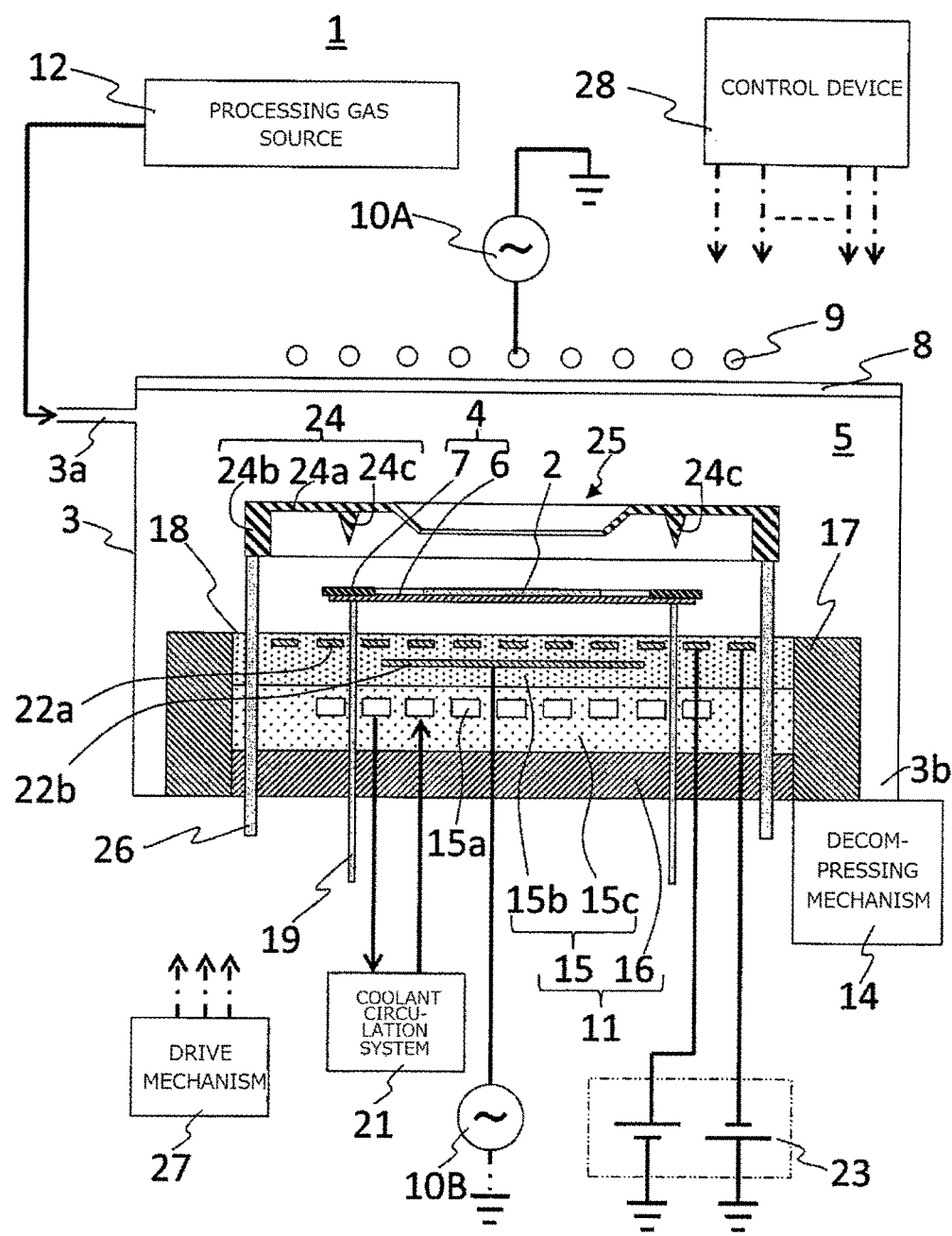
FIG. 4 is a sectional view showing a second state of the plasma processing apparatus according to the first embodiment.

Further, the cover 24 includes a correction member 24c that protrudes from an inside surface of the roof section 24a toward the frame 7 loaded on the stage 11, presses the frame 7 onto the stage 11, and corrects warpage of the frame 7. When the cover 24 covers a part of the holding sheet 6 and the frame 7, the lower end portion of the circumferential side section 24b comes into contact with the stage 11. The lower end portion of the circumferential side section 24b is connected to the top portion of one or more lifting rods 26 that penetrate through the stage 11 and can be lifted and lowered. There is no particular limitation on the drive mechanism that lifts and lowers the lifting rod 26. The lifting rod 26 is driven to be lifted and lowered by the drive mechanism 27 conceptually shown in FIG. 1 and the cover 24 is lifted and lowered along with the lifting rod 26. The lifting rods 26 and the drive mechanism 27 function as a movement device that moves a relative position of the correction member 24c with respect to the frame 7. Specifically, the cover 24 can move to a lowered position at which a part of the holding sheet 6 and the frame 7 of the transport carrier 4 are covered and to a lifted position at which the transport carrier 4 is conveyed into or out from the process chamber 5. FIG. 4 shows a state of the plasma processing apparatus with the cover 24 at the lifted position. It is desirable that an end portion on the center side of the roof section 24a of the cover 24 does not come into direct contact with both the holding sheet 6 and the substrate 2 at the lowered position. This is because it is preferable that heat of the cover 24 heated by the plasma is not transferred to the holding sheet 6 and the substrate 2.

The correction member 24c presses the frame 7 onto the stage 11 at the lowered position. That is, by only adding the correction member 24c to the cover 24, it is possible to reliably apply a mechanical force to the frame 7 onto the stage 11. In this manner, even in a case where the frame 7 has warpage, the warpage is corrected and a gap due to the warpage is not formed between the frame 7 and the stage 11. That is, the warpage correction of the frame 7 makes it possible for the frame 7 to come into reliable contact with the loading surface 18 with the holding sheet 6 interposed therebetween. In addition, the warpage correction of the frame 7 makes it possible to suppress detaching of the holding sheet 6 bonded to the frame 7 from the loading surface 18 and makes it possible for the holding sheet 6 to come into reliable contact with the loading surface 18. Accordingly, it is possible to prevent abnormal discharge due to the warpage of the frame 7 and insufficient cooling of the transport carrier 4. There is no particular limitation on the shape of the correction member 24c but it is desirable to have a mode with which heat received by the roof section 24a from the plasma is unlikely to transfer to the frame 7.

The correction member 24c may be provided to have the same material as the roof section 24a and/or the circumferential side section 24b of the cover 24 and to be integral with the cover 24. Alternatively, a correction member 24c may be provided separately from the cover 24 and the correction member 24c may be fixed to a predetermined position of the cover 24 by being joined to each other to become integral with the cover 24. The correction member 24c may be formed of the same material as the roof section 24a and/or the circumferential side section 24b of the cover 24 or may be formed of a different material.

It is preferable that the correction member 24c is an elastic body. In this case, the cover 24 can be lowered to a position at which the correction member 24c presses the cover 24 and is elastically deformed. Accordingly, the circumferential side section 24*b* is caused to come into reliable contact with the loading surface 18 such that cooling of the cover 24 is effectively performed and it is possible to reliably press the frame 7 by the correction member 24*c* and to correct the warpage of the frame 7. For example, a material with the elasticity is used of at least a portion of the correction member 24*c* and thereby, the correction member 24*c* can have the elasticity. As the material with elasticity, it is preferable to use a resin material having plasma resistance. In addition, in order to enable the correction member 24*c* to have the elasticity, a metallic spring or coil may be assembled therein. In a case where the protruding portion 24*c* is an elastic body, for example, a groove may be formed on the inside surface of the roof section 24*a*, the groove may be fitted with the elastic body, and then, the correction member 24*c* may become integral with the cover 24.

Hereinafter, a state in which the cover 24 of the dry etching apparatus 1 is disposed at the lowered position is referred to as a first state and a state of being disposed at the lifted position is referred to as a second state.

Figure 5:
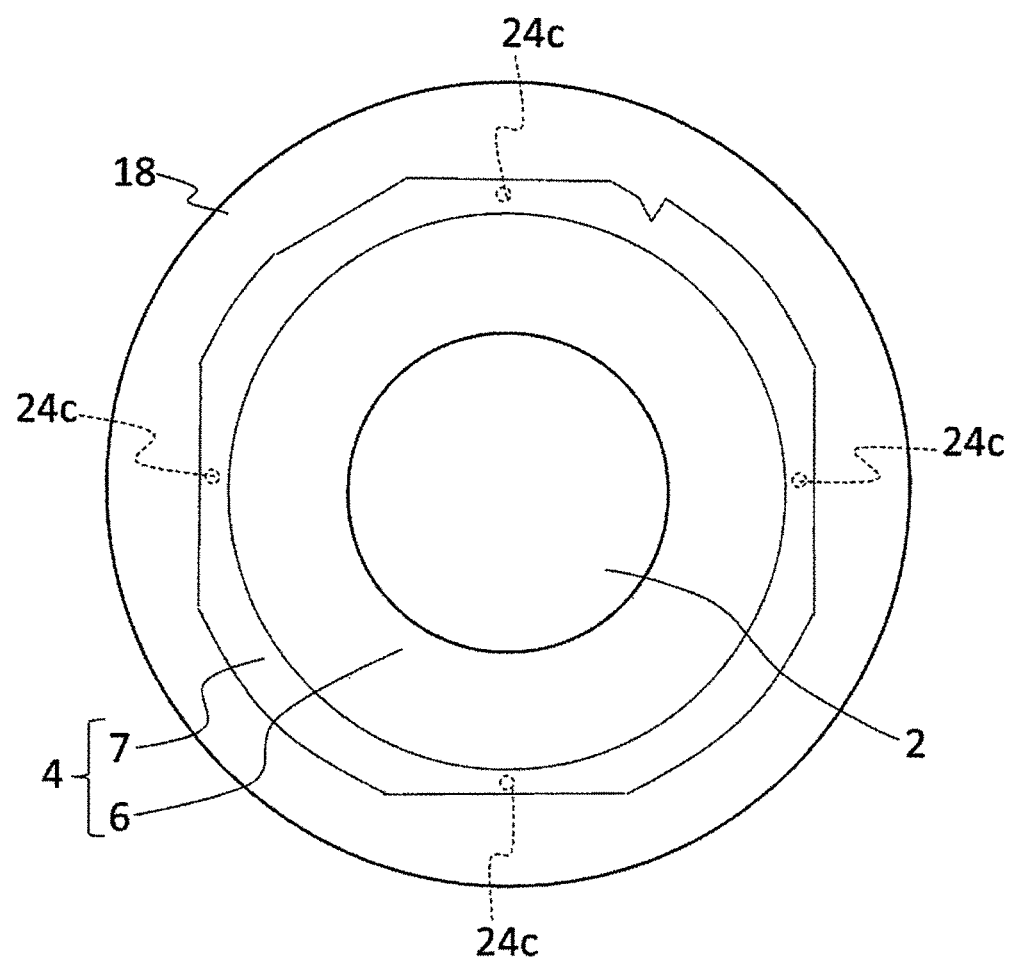
FIG. 5 is a top view showing a positional relationship between the transport carrier loaded on the stage and a correction member.

FIG. 5 is a top view showing a positional relationship between the transport carrier 4 loaded on the stage 11 and the correction member 24*c*. FIG. 5 shows a state in which the dry etching apparatus 1, which is in the first state as shown in FIG. 1, is viewed through the cover 24 from the upper section in the process chamber 5. The transport carrier 4 holding the substrate 2 is loaded on the stage 11 and a plurality of correction members 24*c*, of which the disposed positions are shown by dotted lines, press the frame 7 onto the stage 11 at the lowered position. There is no particular limitation on the number of the correction members 24*c*. When a sufficient effect of warpage correction of the frame 7 is taken into account, it is preferable that the plurality of correction members 24*c* are provided at a certain interval along the frame 7. Particularly, a plurality of (for example, four or more) positions symmetrical with the center of the opening of the frame 7 are pressed onto the stage 11 by the corresponding number of (for example, four or more) correction members 24*c*. In addition, a plurality of (for example, three or more) positions of the frame 7 at an equal interval along the opening of the frame 7 may be pressed by the corresponding number of (for example, three or more) correction members 24*c*.

The conveyance of the transport carrier 4 into and out from the process chamber 5 is performed in cooperation with a plurality of frame lifting pins 19 that penetrate the stage 11 and a transport arm (not shown). Specifically, the frame lifting pins 19 can move to the lowered position (accommodation position) at which the dry etching apparatus 1 has the first state and to the lifted position at which sending out and receiving in of the transport carrier 4 are performed. The frame lifting pins 19 are driven to be lifted and lowered by a predetermined drive mechanism. The transport carrier 4 is lifted and lowered along with the frame lifting pins 19. In FIG. 4, the frame lifting pins 19 are disposed at the lifted position. When the frame lifting pins 19 are lowered, an operation of loading the transport carrier 4 on the stage 11 is performed.

As shown in FIG. 1, it is preferable that electrostatic chucking electrodes 22*a* are accommodated in the vicinity of the loading surface 18 of the dielectric section 15*b*. The electrostatic chucking electrodes 22*a* are electrically connected to a DC power source 23. In this manner, the loading surface 18 of the transport carrier 4 functions as an electrostatic chuck. The electrostatic chucking electrodes 22*a* may be bipolar type or single polar type.

A lower electrode 22*b* that is electrically connected to a second high-frequency power source 10B is disposed below the electrostatic chucking electrodes 22*a*. A bias voltage is applied to the lower electrode 22*b* from the second high-frequency power source 10B and thereby, energy generated when ions in the plasma are incident to the substrate 2 is controlled.

Operations of the respective components of the dry etching apparatus 1 are controlled by a control device 28 conceptually shown in FIG. 1. Here, the components of the dry etching apparatus 1 include the first and second high-frequency power sources 10A and 10B, the processing gas source 12, the decompressing mechanism 14, the coolant circulation system 21, the DC power source 23, and the drive mechanism 27. That is, the drive mechanism 27 controls each operation of the lifting rod 26 in response to an instruction from the control device 28. Each operation of the frame lifting pin 19 is controlled by a predetermined drive mechanism in response to an instruction from the control device 28.

Next, each process for performing the plasma processing on the substrate 2 held on the transport carrier 4 will be exemplarily described.

First, the transport carrier 4 holding the substrate 2 is conveyed into the process chamber 5 of the dry etching apparatus 1 having the second state, by a transport mechanism (not shown). At this time, the transport carrier 4 is delivered to the frame lifting pins 19 which are disposed at the lifted position (refer to FIG. 4). Next, the frame lifting pins 19 are lowered and the transport carrier 4 is loaded on the loading surface 18 of the stage 11. At this time, the cover 24 is disposed at the lifted position.

Next, the lifting rods 26 are caused to move from the lifted position to the lowered position by the drive mechanism 27 and the frame 7 of the transport carrier 4 loaded on the stage 11 is pressed onto the stage 11 by the correction member 24*c*. In this manner, the warpage of the frame 7 is corrected such that a gap due to the warpage is not formed between the frame 7 and the loading surface 18 of the stage 11. The warpage correction of the frame 7 makes it possible for the frame 7 to come into reliable contact with the loading surface 18 with the holding sheet 6 interposed. In addition, the warpage correction of the frame 7 makes it possible to suppress detaching of the holding sheet 6 bonded to the frame 7 from the loading surface 18 and makes it possible for the holding sheet 6 to come into reliable contact with the loading surface 18.

At this time, a part of the holding sheet 6 and the frame 7 of the transport carrier 4 are covered by the cover 24. Meanwhile, the substrate 2 is exposed through the window section 25 of the cover 24. In this manner, the dry etching apparatus 1 achieves the first state.

In a case where the electrostatic chucking electrodes 22*a* are accommodated in the vicinity of the loading surface 18 of the dielectric section 15*b* of the stage 11, a DC voltage is applied to the electrostatic chucking electrodes 22*a* from the DC power source 23. Since the frame 7 is in reliable contact with the loading surface 18 with the holding sheet 6 interposed in a state in which the warpage is corrected, the frame 7 and the loading surface 18 can be reliably adsorbed electrostatically by the voltage applying and the frame 7 can be cooled. Similarly, since the holding sheet 6 is in reliable contact with the loading surface 18 in a state in which the detaching from the loading surface 18 is suppressed, the holding sheet 6 and the substrate 2 bonded thereto and the loading surface 18 can be reliably adsorbed electrostatically by the voltage applying and the holding sheet 6 and the substrate 2 can be cooled.

Next, plasma is caused to be generated in the process chamber 5 of the chamber 3 and the plasma processing is performed on the substrate 2 that is exposed through the window section 25 of the cover 24. Specifically, while a process gas for plasma dicing is guided into the process chamber 5 from the processing gas source 12, air emission from the process chamber 5 is performed by the decompressing mechanism 14 and the process chamber 5 is maintained to have a predetermined pressure. Then, high-frequency power is supplied to the upper electrode (antenna) 9 from the first high-frequency power source 10A such that plasma is caused to be generated in the process chamber 5 and the substrate 2 is irradiated with the plasma. At this time, a bias voltage is applied to the electrode section 15 of the stage 11 from the second high-frequency power source 10B.

The portion (street) that is exposed through the resist mask of the substrate 2 is removed from the surface to the back surface by physicochemical effects of radicals and ions in the plasma and the substrate 2 is individualized into a plurality of chips.

After the plasma dicing is completed, ashing is performed. While a process gas (for example, oxygen gas) for ashing is guided into the process chamber 5 from an ashing gas source (not shown), air emission from the process chamber 5 is performed by the decompressing mechanism 14 and the process chamber 5 is maintained to have the predetermined pressure. Then, high-frequency power is supplied to the upper electrode (antenna) 9 from the first high-frequency power source 10A such that plasma is caused to be generated in the chamber 3 and the substrate 2 is irradiated with the plasma. Oxygen plasma irradiation causes the resist mask to be removed from the surface of the substrate 2. After an ashing process is completed, the transport carrier 4 is conveyed out from the process chamber 5 by the transport mechanism.

The plasma processing that is performed in the dry etching apparatus 1 is not limited to the plasma dicing, the ashing, or the like, and the plasma processing may be the common dry etching. In addition, the dry etching apparatus is not limited to an ICP type as in the embodiments described above, and may be a parallel plate type. Further, the plasma processing apparatus of the present invention is not limited to the dry etching apparatus and can also be applied to another plasma processing apparatus such as a CVD apparatus.

The electrostatic chucking electrodes that function as an electrostatic chuck is not necessarily provided. In a case where the frame contains a semiconductor material and/or a conductive material, it is desirable that the electrostatic chucking electrode is provided in the vicinity of the loading surface 18 of the dielectric section 15b. In this manner, even in a case where pressure by the correction member 24c loosens, the electrostatic chucking electrode causes an electrostatic attractive force to be applied to the frame and the frame is likely to come into close contact with the stage. Once the frame 7 is pressed onto the stage 11 by the correction member 24c, a gap is unlikely to be formed between the frame 7 and the stage 11 due to the electrostatic chuck even when the correction member 24c even stops pressing.

Second Embodiment

Figure 6A:
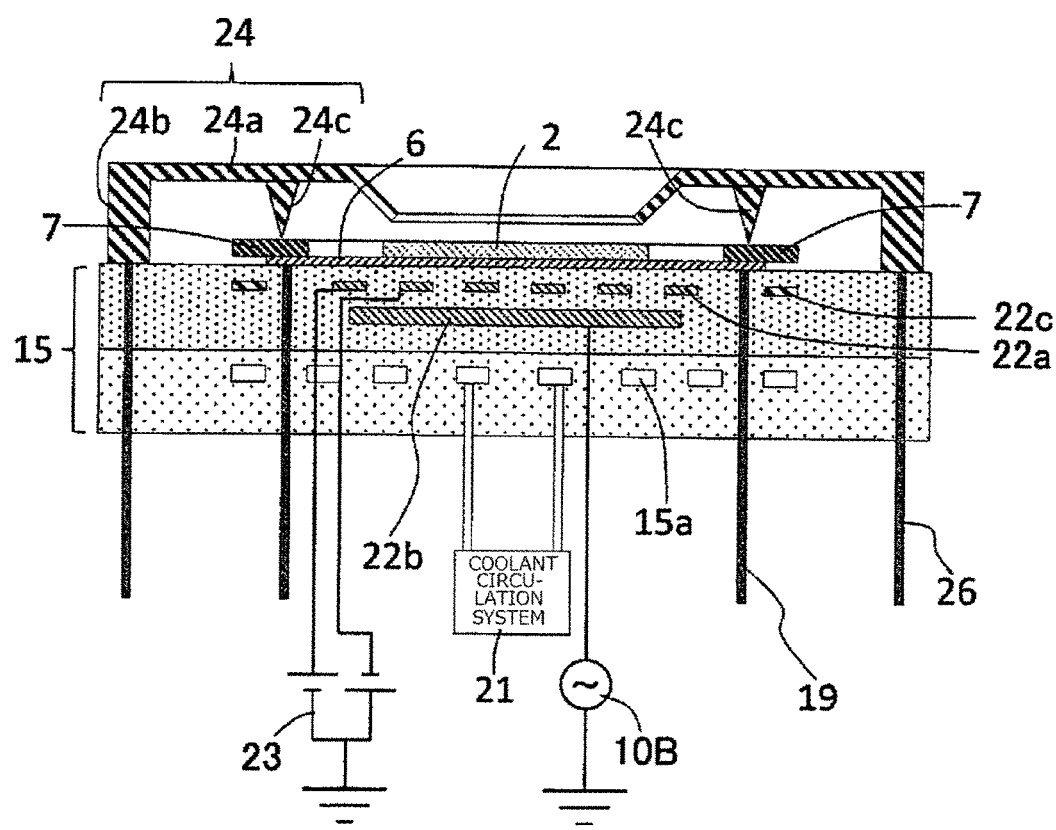
FIG. 6A is an enlarged sectional view showing main components in a first state of a plasma processing apparatus according to a second embodiment.
Figure 6B:
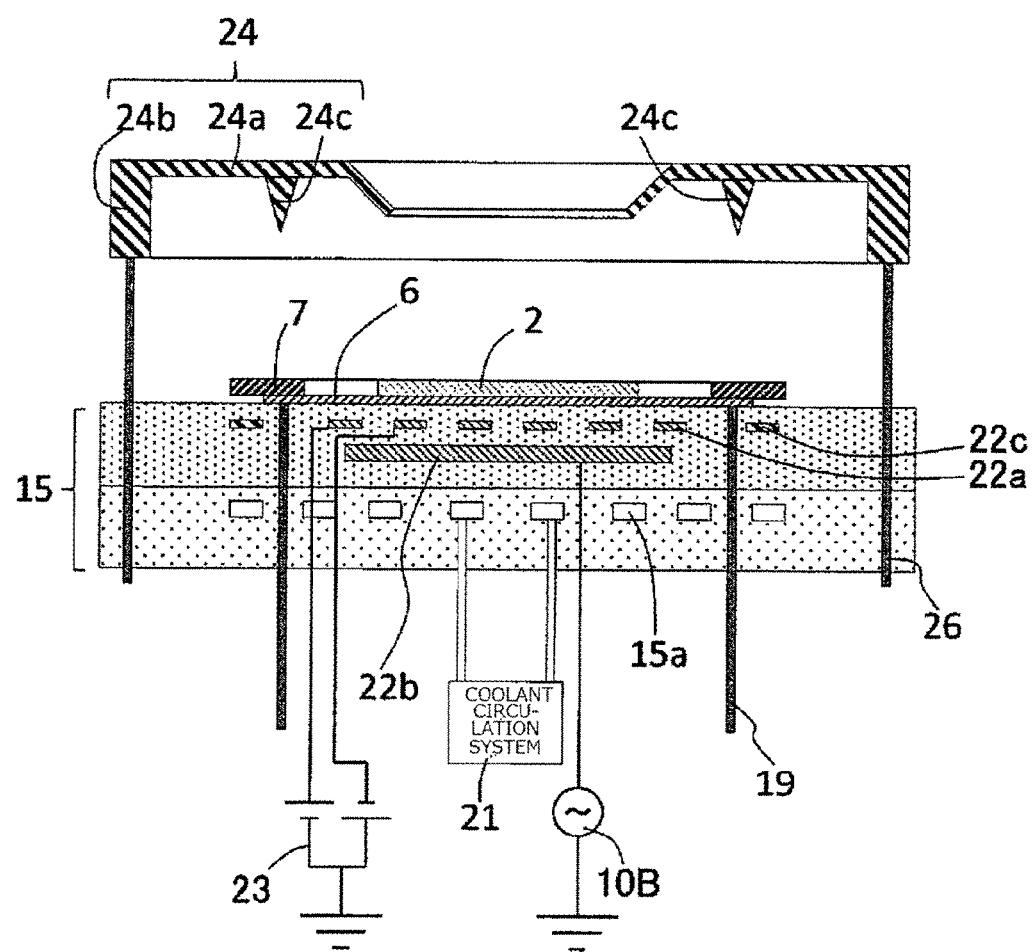
FIG. 6B is an enlarged sectional view showing the main components in a second state of the plasma processing apparatus according to the second embodiment.

FIG. 6A and FIG. 6B are sectional views conceptually showing structures of main components in a first state and in a second state, respectively, of a plasma processing apparatus according to a second embodiment of the present invention.

The present embodiment is different from the first embodiment in that a magnetic force source 22c is disposed in the stage. As the magnetic force source 22c, for example, an electromagnet, a permanent magnet, or the like can be used. Accordingly, in a case where the frame 7 contains a magnetic material, a magnetic force is caused to be applied to the frame 7 by the magnetic force source 22c, the frame 7 is attracted to the electrode section 15 of the stage 11 by the magnetic force, and close contact therebetweeen can be achieved. In this manner, a more stable process can be achieved. When this effect is taken into account, it is preferable that the magnetic force source 22c is disposed to face the frame 7 in the vicinity of the loading surface 18 of the dielectric section 15b of the stage 11. Examples of the magnetic material include iron, nickel, and the like.

Figure 6C:
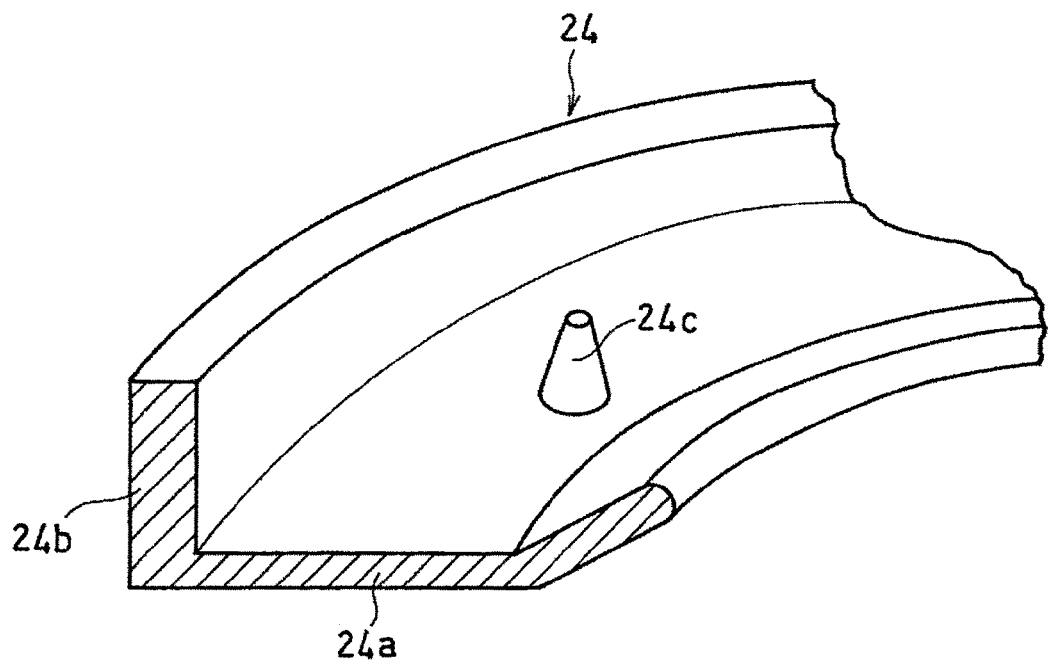
FIG. 6C is a perspective view of a protruding portion which is a correction member that protrudes from an inside surface of a roof section of a cover according to the second embodiment.

FIG. 6C is a perspective view of the protruding portion 24c which is a correction member that protrudes from an inside surface of the roof section 24a of a cover 24 according to the present embodiment. In FIG. 6A and FIG. 6B, the protruding portion 24c is conceptually shown as a pointed cone at its tip; however, it is preferable that a contact surface between the protruding portion 24c and the frame 7 is a flat surface or a spherical surface as shown in FIG. 6C. A plurality of the protruding portions 24c are provided at a certain interval along the frame 7.

The protruding portion 24c has a small area of a portion which comes into contact with the frame 7 compared to the contact surface with the roof section 24a. According to the protruding portion 24c, since heat received by the cover 24 from the plasma is unlikely to be transferred to the frame 7, a significant effect of preventing insufficient cooling of the frame 7 is achieved. The shape of the protruding portion 24c is not limited to the cone as shown in the drawings but may be a truncated pyramid with which a contact surface with the roof section 24a is polygon.

Third Embodiment

Figure 7A:
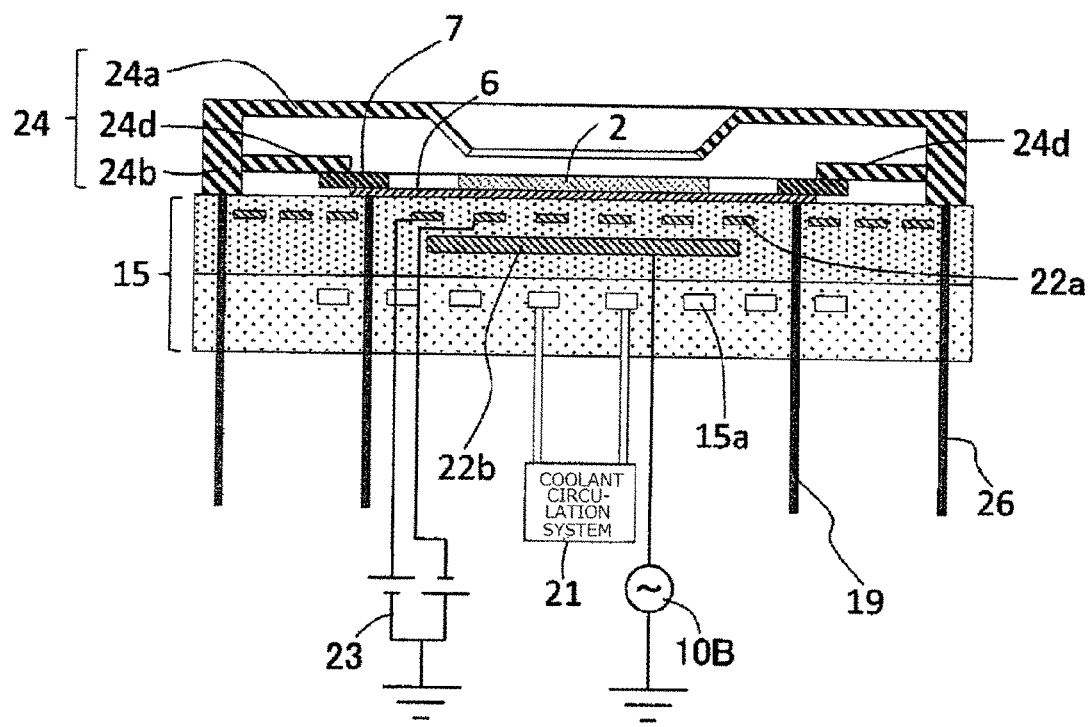
FIG. 7A is an enlarged sectional view showing main components in a first state of a plasma processing apparatus according to a third embodiment.
Figure 7B:
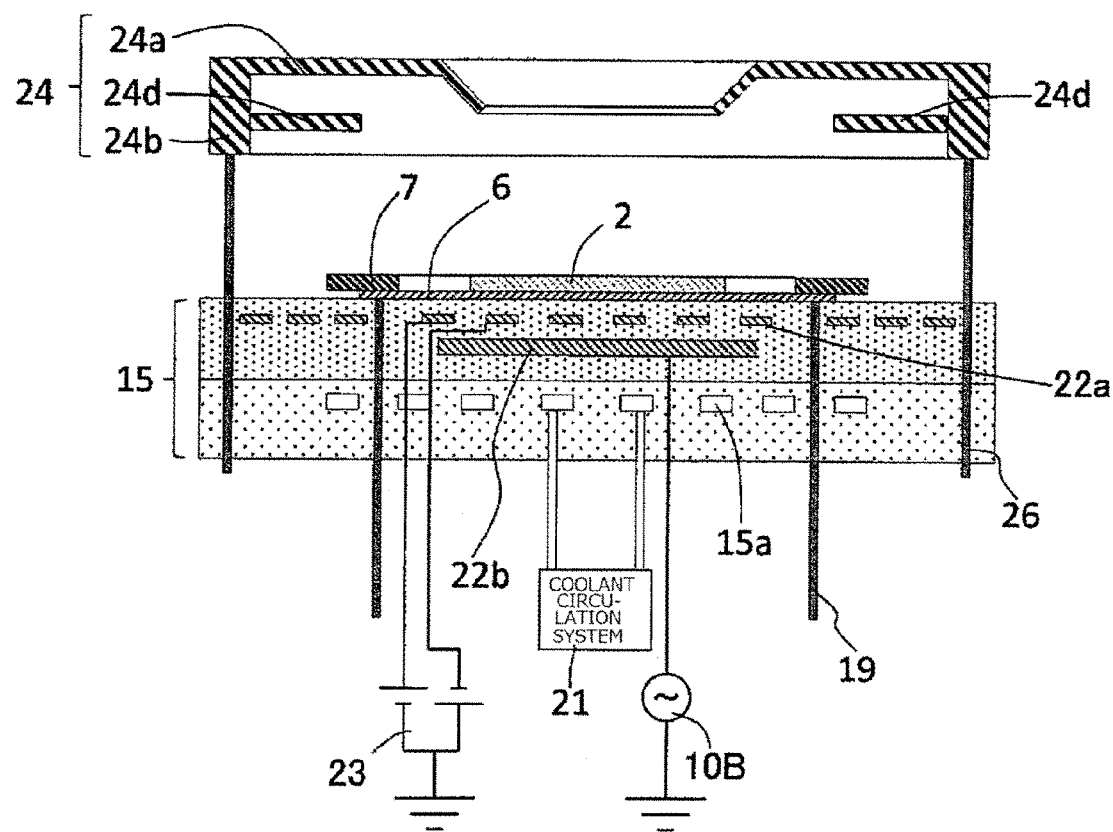
FIG. 7B is an enlarged sectional view showing the main components in a second state of the plasma processing apparatus according to the third embodiment.
Figure 7C:
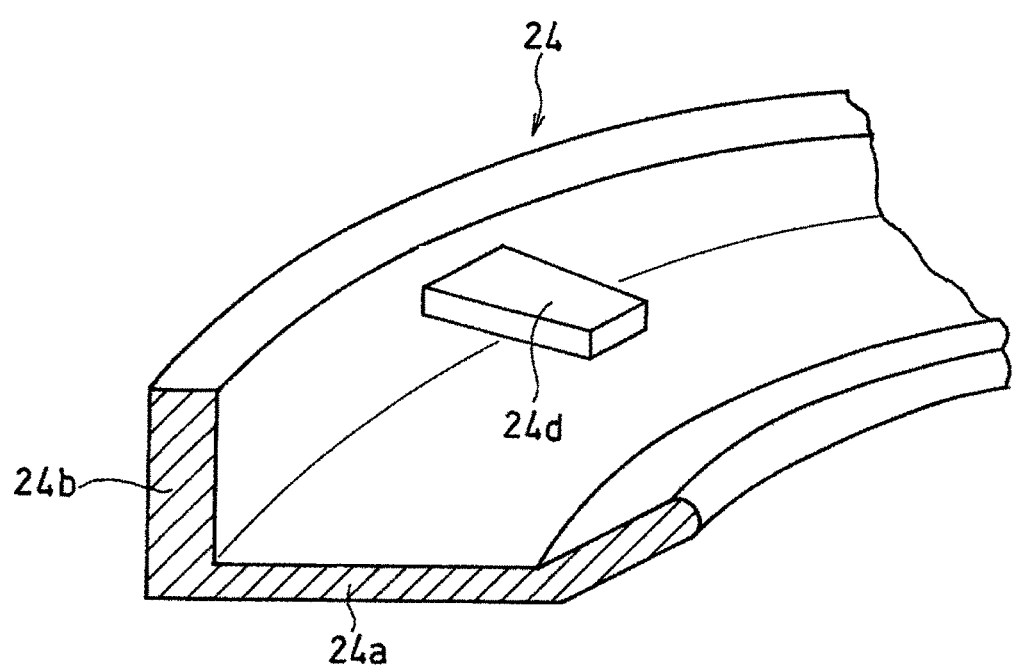
FIG. 7C is a perspective view of a branch portion which is a correction member that protrudes from a circumferential side section of a cover according to the third embodiment.

FIG. 7A and FIG. 7B are sectional views conceptually showing structures of main components in a first state and in a second state, respectively, of a plasma processing apparatus according to a third embodiment of the present invention. FIG. 7C is a perspective view of the branch portion 24d which is a correction member that protrudes from an inside surface of the circumferential side section 24b of the cover 24 according to the present embodiment.

The present embodiment is different from the first embodiment in that the branch portion 24d, as the correction member, that protrudes from the circumferential side section 24b of the cover 24 presses the frame 7. A plurality of the branch portions 24d are provided at a certain interval along the frame 7.

Since the branch portion 24d protrudes not only from the roof section 24a that directly receives heat of the plasma but also from the circumferential side section 24b, the heat received by the cover 24 from the plasma is unlikely to transfer to the frame 7. Accordingly, a significant effect of preventing insufficient cooling of the frame 7 is achieved. The shape of the branch portion 24d is not limited to the plate shape as shown in the drawings but may have a rod shape.

Fourth Embodiment

Figure 8A:
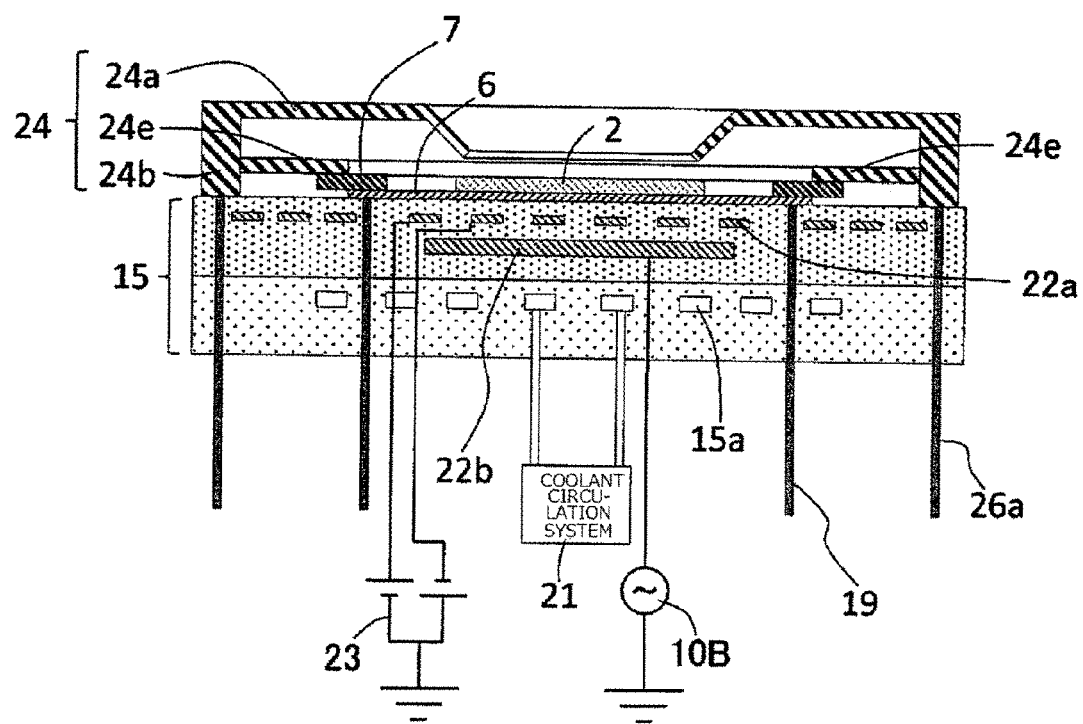
FIG. 8A is an enlarged sectional view showing main components in a first state of a plasma processing apparatus according to a fourth embodiment.
Figure 8B:
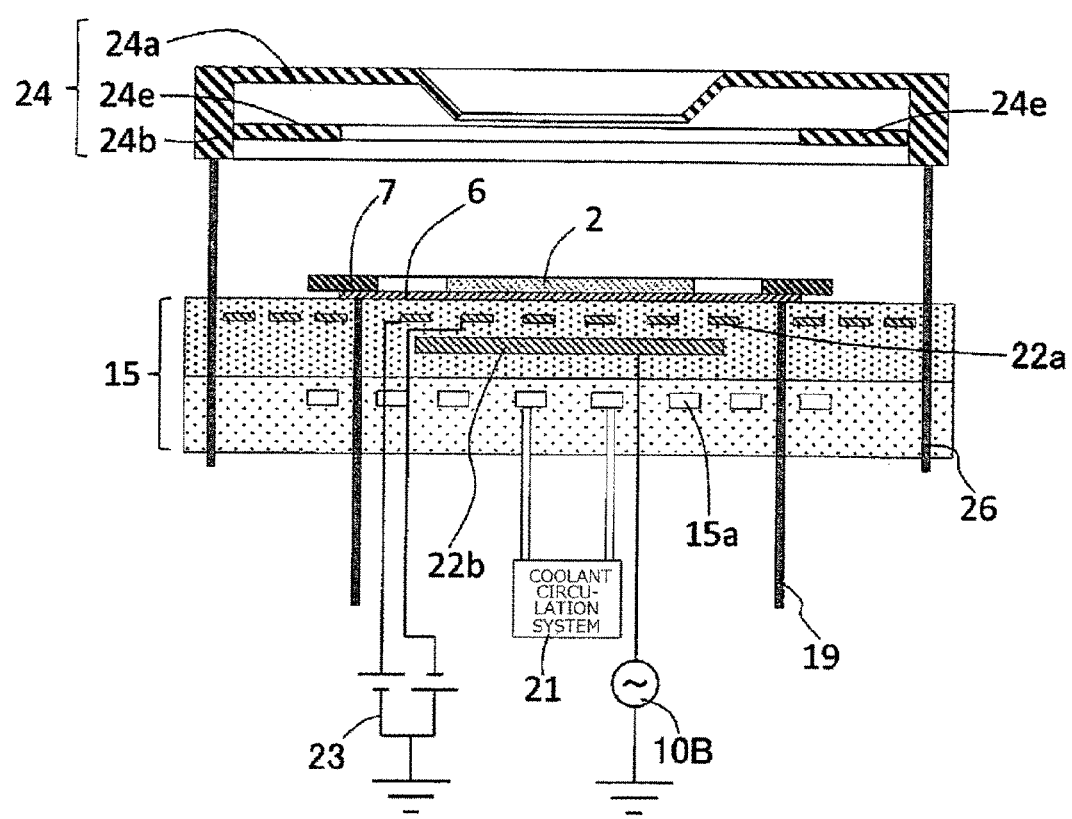
FIG. 8B is an enlarged sectional view showing the main components in a second state of the plasma processing apparatus according to the fourth embodiment.
Figure 8C:
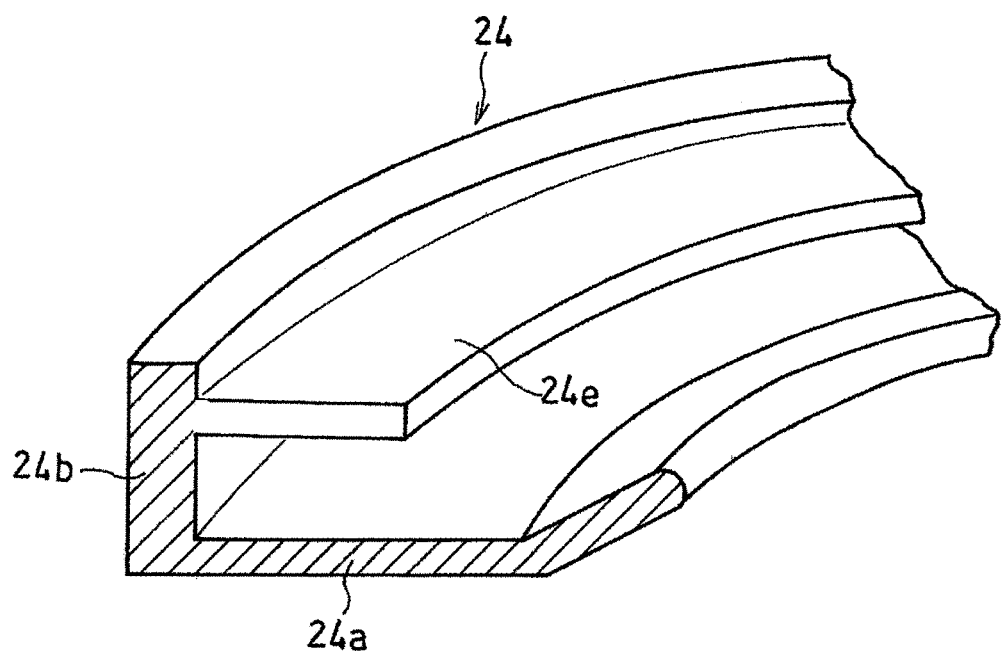
FIG. 8C is a cutout perspective view of an annular flange which is a correction member that protrudes from an inside surface of a circumferential side section of a cover according to the fourth embodiment.

FIG. 8A and FIG. 8B are sectional views conceptually showing structures of main components in a first state and in a second state, respectively, of a plasma processing apparatus according to a fourth embodiment of the present invention. FIG. 8C is a cutout perspective view of the annular flange 24e which is a correction member that protrudes from an inside surface of the circumferential side section 24b of the cover 24 according to the present embodiment.

The present embodiment is different from the first embodiment in that the annular flange 24e, as the correction member, that protrudes from the circumferential side section 24b of the cover 24 presses the frame 7. The annular flange 24e may be provided all over the entire circumference of the circumferential side section 24b along the frame 7 or the annular flange 24e may be partially notched.

Since the annular flange 24e protrudes not only from the roof section 24a that directly receives heat of the plasma but also from the circumferential side section 24b, the heat received by the cover 24 from the plasma is unlikely to transfer to the frame 7. Accordingly, a significant effect of preventing insufficient cooling of the frame 7 is achieved. In addition, since the contact area with the frame 7 is comparatively great, the frame 7 is pressed onto the electrode section 15 of the stage 11 with a great force. Accordingly, a significant effect of enhancing the process stability is achieved.

Fifth Embodiment

Figure 9A:
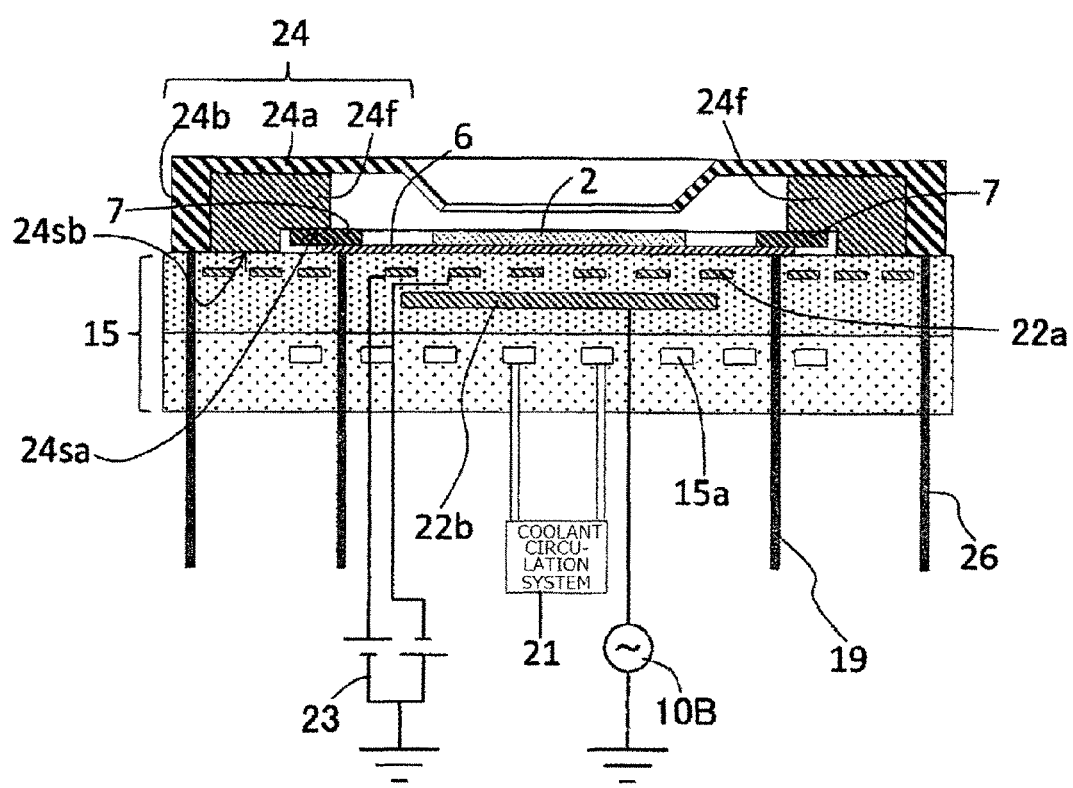
FIG. 9A is an enlarged sectional view showing main components in a first state of a plasma processing apparatus according to a fifth embodiment.
Figure 9B:
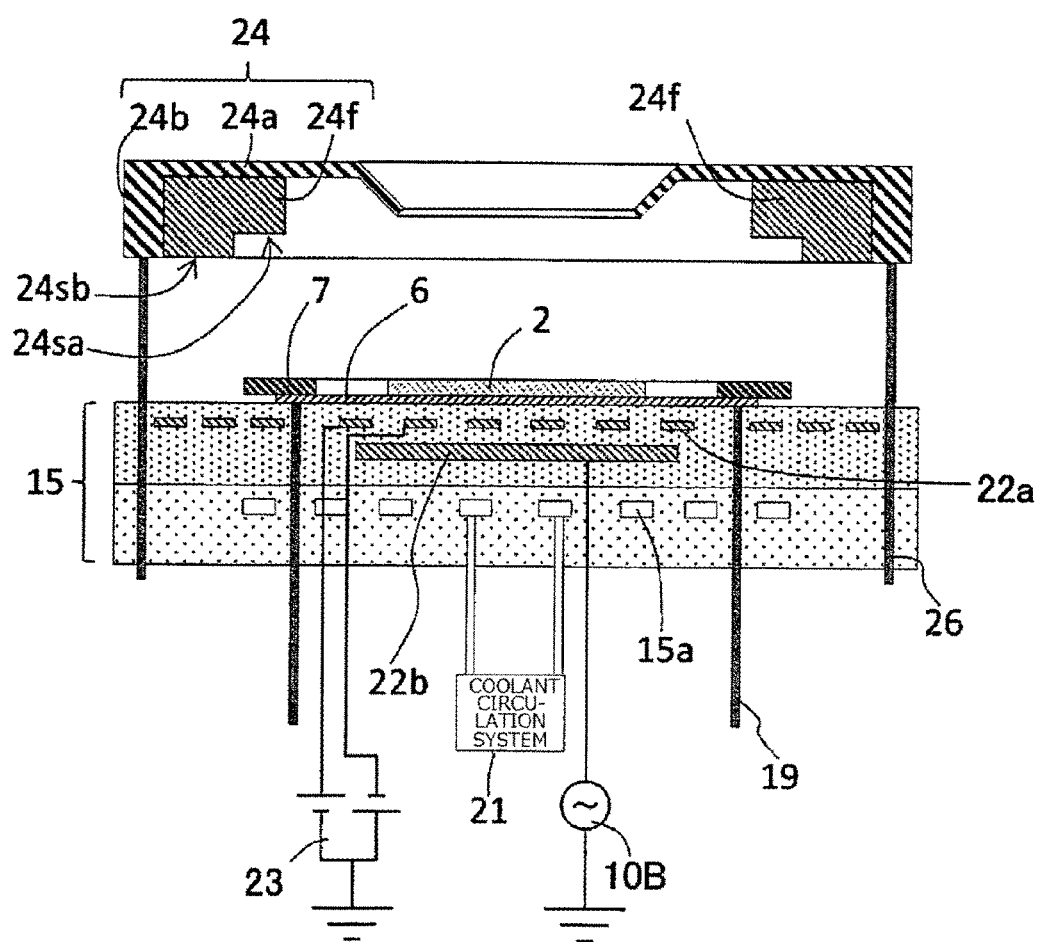
FIG. 9B is an enlarged sectional view showing the main components in a second state of the plasma processing apparatus according to the fifth embodiment.
Figure 9C:
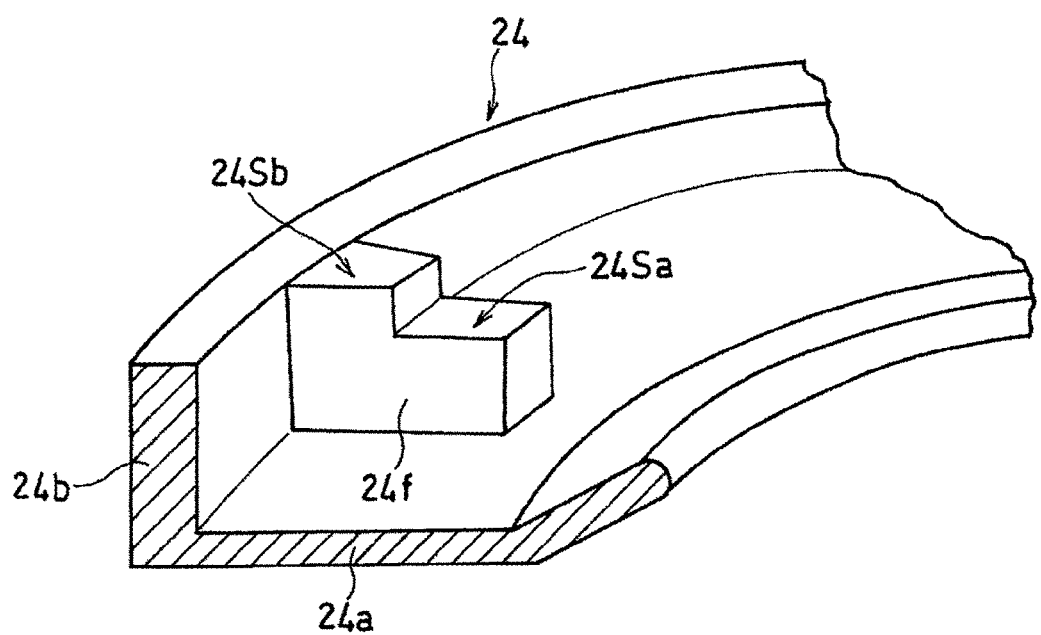
FIG. 9C is a perspective view of a protruding portion which is a correction member that protrudes from a roof section and an inside surface of a circumferential side section of a cover according to the fifth embodiment.

FIG. 9A and FIG. 9B are sectional views conceptually showing structures of main components in a first state and in a second state, respectively, of a plasma processing apparatus according to a fifth embodiment of the present invention. FIG. 9C is a perspective view of the protruding portion 24f which is a correction member that protrudes from the roof section 24a and the inside surface of the circumferential side section 24b of a cover 24 according to the present embodiment.

The present embodiment is different from the first embodiment in that, when in the first state, that is, when a correction member 24f presses the frame 7 onto the electrode section 15 of the stage 11, the correction member 24f includes a first contact surface 24Sa that comes into contact with the frame 7 and the second contact surface 24Sb that comes into contact with the stage 11. Since the stage 11 is cooled by the cooling mechanism, the correction member 24f that comes into contact with the stage 11 is cooled. In this manner, the correction member 24f can be cooled through the frame 7. Accordingly, a high cooling effect can be achieved. In addition, since the correction member 24f is formed to be integral with the cover 24, the cover 24 is also cooled. In this manner, it is possible to control radiation heat which radiates from the cover 24 to the holding sheet 6 and the frame 7. Accordingly, a significant effect of cooling the transport carrier 4 is achieved. In addition, in an example in the drawings, the correction member 24f is in contact with or is continuous to both the roof section 24a and the circumferential side section 24b of the cover 24; however, the correction member 24f may be in contact with or is continuous to only one of the roof section 24a and the circumferential side section 24b.

In a case where the stage 11 is allowed to come into contact with the correction member 24f, it is possible to increase a volume of the correction member 24f. In this manner, thermal capacity of the correction member 24f becomes greater and thus, an area of the second contact surface 24Sb that comes into contact with the stage 11 becomes greater. Accordingly, heat exchange between the correction member 24f and the stage 11 is efficiently performed. Similarly, an area of the first contact surface 24Sa that comes into contact with the frame 7 becomes greater. Accordingly, heat exchange between the correction member 24f and the frame 7 is efficiently performed. When the effect described above is taken into account, it is effective to have a thermal conductivity of the correction member 24f to be greater than a thermal conductivity of the roof section 24a of the cover 24. It is preferable that examples of the material of the correction member 24f include metal such as aluminum, an aluminum alloy, or stainless steel, aluminum on which an alumite process is performed, and the like.

Sixth Embodiment

Figure 10A:
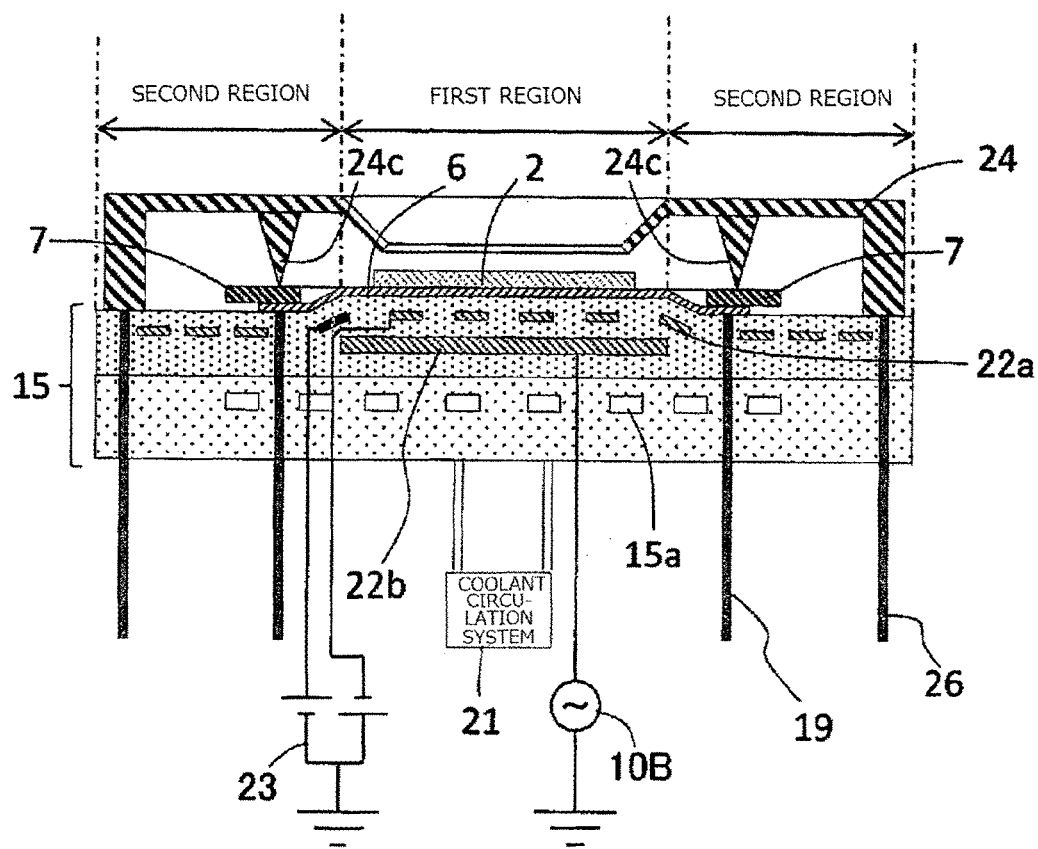
FIG. 10A is an enlarged sectional view showing main components in a first state of a plasma processing apparatus according to a sixth embodiment.
Figure 10B:
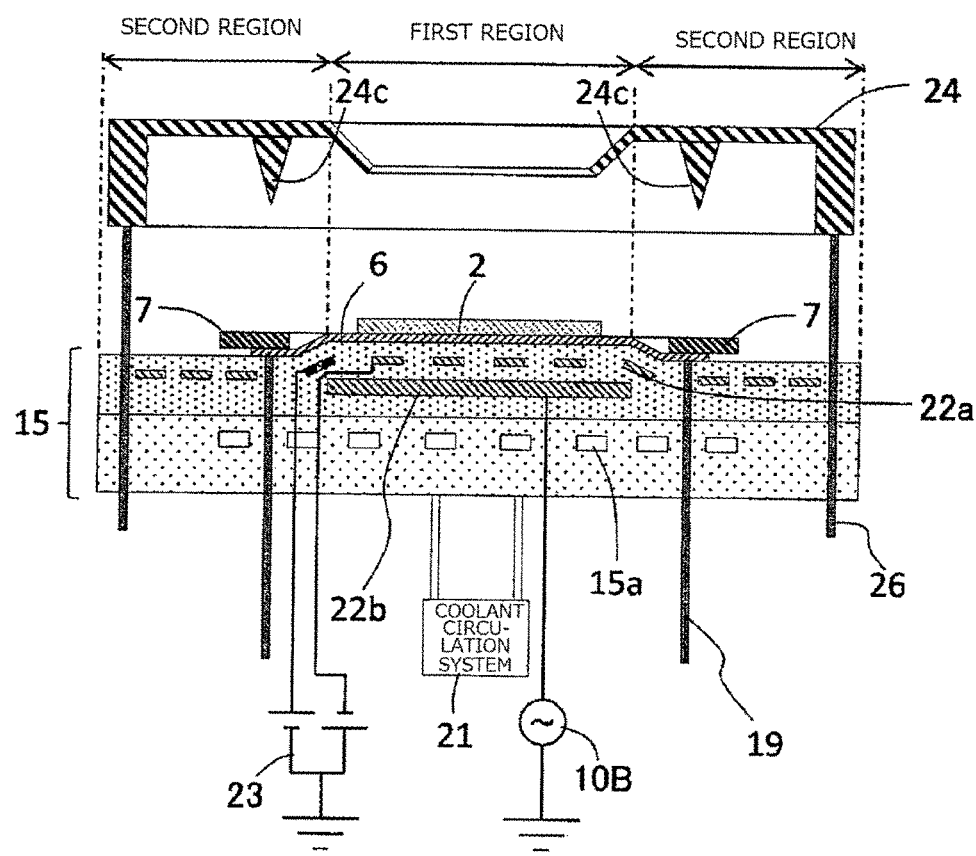
FIG. 10B is an enlarged sectional view showing the main components in a second state of the plasma processing apparatus according to the sixth embodiment.

FIG. 10A and FIG. 10B are sectional views conceptually showing structures of main components in a first state and in a second state, respectively, of a plasma processing apparatus according to a sixth embodiment of the present invention.

The present embodiment is different from the first embodiment in that a surface that comes into contact with the transport carrier 4 of the stage 11 has a flat first region which faces the substrate 2 held on the transport carrier 4 and a second region that is provided to surround the first region and has an elevation lower than the first region. When the correction member 24c presses the frame 7 onto the electrode section 15 of the stage 11, the frame 7 faces the second region. In this manner, an appropriate tensile force is applied to the holding sheet 6 and the substrate 2 comes into contact with the first region with high adhesiveness. Accordingly, the stability of the process is further enhanced. A difference between the elevations of the first region and the second region is, for example, preferably 0.5 mm or more and more preferably 1 mm or more. However, when the difference between the elevations becomes greater, a load on the holding sheet 6 becomes heavier. Thus, it is preferable that the difference between the elevations is 5 mm or less.

Seventh Embodiment

Figure 11A:
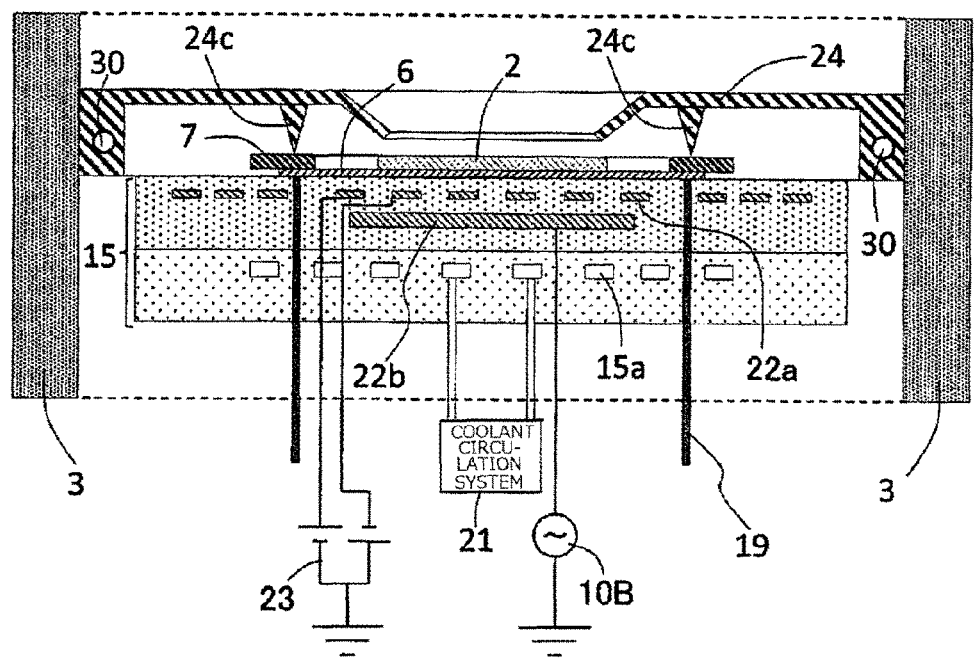
FIG. 11A is an enlarged sectional view showing main components in a first state of a plasma processing apparatus according to a seventh embodiment.
Figure 11B:
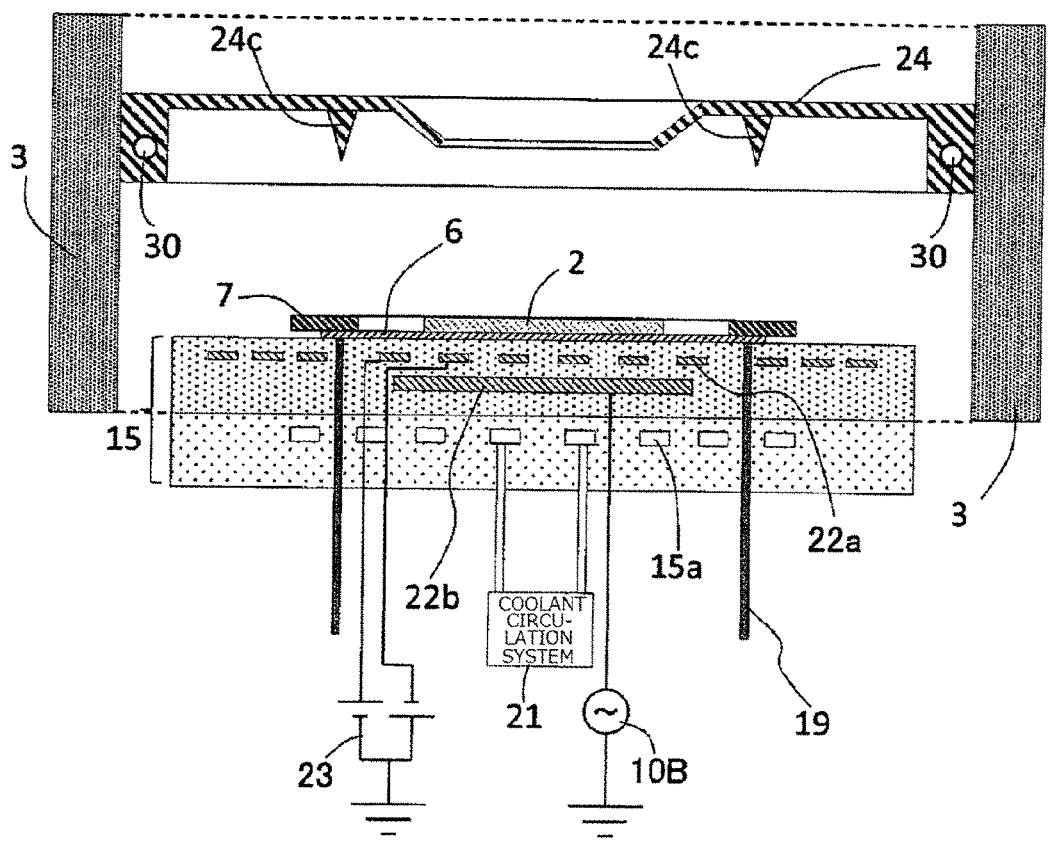
FIG. 11B is an enlarged sectional view showing the main components in a second state of the plasma processing apparatus according to the seventh embodiment.

FIG. 11A and FIG. 11B are sectional views conceptually showing structures of main components in a first state and in a second state, respectively, of a plasma processing apparatus according to a seventh embodiment of the present invention. Here, a state in which the cover 24 of the dry etching apparatus 1 is disposed at the lowered position relatively to the stage 11 (electrode section 15) is referred to as the first state and a state of being disposed at the relatively lifted position is referred to as the second state.

The present embodiment is different from the first embodiment in that the cover 24 is fixed to a side wall of the chamber 3 and the stage 11 is movable with respect to the cover 24. At this time, naturally, the correction member 24c is also fixed to the chamber 3. In this case, the drive mechanism for lifting and lowering the cover 24 is unnecessary and the drive mechanism for lifting and lowering the stage 11 is necessary. The drive mechanism for lifting and lowering the stage 11 functions as a movement device that moves a relative position of the cover 24 with respect to the frame 7.

According to the present invention, since the cover 24 is fixed to the chamber 3, an intra-cover coolant flow path 30 is accommodated in the cover 24 and it is easy to provide a mechanism that circulates coolant. Accordingly, it is difficult to suppress a temperature increase of the cover 24. In this manner, it is possible to suppress radiation heat that radiates from the cover 24 to the holding sheet 6 and the frame 7 and a significant effect of cooling the transport carrier 4 is achieved.

In a plasma processing apparatus and a processing method of the embodiments of the present invention, a substrate held on a transport carrier is used in plasma processing such that it is possible to stably perform various types of etching in addition to plasma dicing without being greatly influenced by a state of the transport carrier.

What is claimed is:

1. A plasma processing apparatus that performs plasma processing on a substrate held on a transport carrier which has an annular frame and a holding sheet, the plasma processing apparatus comprising:
    a chamber that has a process chamber configured to be decompressed;
    a plasma excitation device that generates plasma in the process chamber;
    a stage in the chamber, on which the transport carrier is loaded;
    a cooling mechanism configured to cool the stage; a cover that covers a part of the holding sheet and at least a part of the frame of the transport carrier loaded on the stage and that has a window section through which at least a part of the substrate is exposed to plasma; and
    a movement device that changes a relative position of the cover with respect to the frame, wherein
    the cover has
        a roof section that faces the frame loaded on the stage,
        a side section that extends from an outer edge of the roof section to a side of the stage, and
        a correction member that protrudes from the roof section and/or the side section toward the frame loaded on the stage and presses the frame onto the stage to correct warpage of the frame, and
    the correction member has at least one protruding portion that protrudes at least from the roof section toward the frame.

2. The plasma processing apparatus according to claim 1, wherein
    the correction member has an annular flange that protrudes from the side section toward the frame.

3. The plasma processing apparatus according to according to claim 1, further comprising
    an electrostatic chuck that is provided within the stage, wherein
    the electrostatic chuck exerts an electrostatic force to the frame to cause the frame to be in close contact with the stage.

4. The plasma processing apparatus according to claim 1, further comprising
    a magnetic force source that is provided within the stage, wherein
    the frame contains a magnetic material, and
    the magnetic force source exerts a magnetic force to the frame to cause the frame to be in close contact with the stage.

5. The plasma processing apparatus according to claim 1, wherein
    the side section that extends from the outer edge of the roof section to the side of the stage is, a cylindrical circumferential side section that extends from a circumferential edge of the roof section to the side of the stage.

6. The plasma processing apparatus according to claim 1, wherein
    a distance between a lower end of the correction member and the stage is smaller than a distance between a lower end portion of an inner edge of the roof section and the stage.

7. The plasma processing apparatus according to claim 1, wherein
    the protruding portion has a first contact portion that comes into contact with the frame and a second contact portion that comes into contact with the stage when the protruding portion presses the frame onto the stage.

8. The plasma processing apparatus according to claim 7, wherein
    the correction member has thermal conductivity greater than thermal conductivities of the roof section and the side section.

9. The plasma processing apparatus according to claim 1, wherein
    a plurality of the protruding portions or branch portions that protrude from the side section toward the frame are provided at intervals to be along the frame.

10. The plasma processing apparatus according to claim 9, wherein
    the plurality of the protruding portions or branch portions that protrude from the side section toward the frame are provided at certain intervals to be along the frame.

11. The plasma processing apparatus according to claim 1, wherein
    a surface of the stage, which comes into contact with the transport carrier, has a flat first region facing the substrate held on the transport carrier and a second region that is provided to surround the first region at an elevation lower than the first region, and
    when the correction member presses the frame onto the stage, the frame of the transport carrier faces the second region.

12. A plasma processing method of performing plasma processing on a substrate held on a transport carrier that has an annular frame and a holding sheet, the plasma processing method comprising:
    (i) a step of conveying the transport carrier holding the substrate into a chamber provided in a plasma processing apparatus and loading the transport carrier on a stage that is equipped with a cooling mechanism and provided in the chamber;
    (ii) a step of covering the holding sheet and the frame of the transport carrier loaded on the stage, with a cover that has a window section through which at least a part of the substrate is exposed to plasma; and
    (iii) a step of generating plasma in the chamber and performing the plasma processing on the at least a part of the substrate through the window section, wherein
    the cover has
        a roof section that faces the frame loaded on the stage,
        a side section that extends from an outer edge of the roof section to a side of the stage, and
        a correction member that protrudes from the roof section toward the frame loaded on the stage and presses the frame onto the stage to correct warpage of the frame, and
    warpage of the frame is corrected by the correction member in the step (ii).

13. The plasma processing method according to claim 12, wherein
    the side section that extends from the outer edge of the roof section to the side of the stage is, a cylindrical circumferential side section that extends from a circumferential edge of the roof section to the side of the stage.

14. A plasma processing apparatus that performs plasma processing on a substrate held on a transport carrier which has an annular frame and a holding sheet, the plasma processing apparatus comprising:

a chamber that has a process chamber configured to be decompressed;

a plasma excitation device that generates plasma in the process chamber;

a stage in the chamber, on which the transport carrier is loaded;

a cooling mechanism configured to cool the stage;

a cover that covers a part of the holding sheet and at least a part of the frame of the transport carrier loaded on the stage and that has a window section through which at least a part of the substrate is exposed to plasma; and a movement device that changes a relative position of the cover with respect to the frame, wherein the cover has a roof section that faces the frame loaded on the stage, a side section that extends from an outer edge of the roof section to a side of the stage, and a correction member that protrudes from the roof section and/or the side section toward the frame loaded on the stage and presses the frame onto the stage to correct warpage of the frame, wherein the correction member comprises an elastic body.

15. The plasma processing apparatus according to claim 14, wherein a metallic spring or coil is assembled in the correction member.

16. The plasma processing apparatus according to claim 14, wherein a material with a elasticity is used of at least a portion of the correction member and thereby, the correction member can have the elasticity.

17. The plasma processing apparatus according to claim 16, wherein the material with the elasticity is a resin material.

\* \* \* \* \*